(12) United States Patent
Sato

(10) Patent No.: US 9,778,565 B2
(45) Date of Patent: Oct. 3, 2017

(54) IMPRINT APPARATUS AND ARTICLE MANUFACTURING METHOD

(71) Applicant: CANON KABUSHIKI KAISHA, Tokyo (JP)

(72) Inventor: Hiroshi Sato, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/400,081

(22) Filed: Jan. 6, 2017

(65) Prior Publication Data

US 2017/0115559 A1    Apr. 27, 2017

Related U.S. Application Data

(60) Continuation of application No. 14/272,782, filed on May 8, 2014, now Pat. No. 9,575,407, which is a
(Continued)

(30) Foreign Application Priority Data

Dec. 2, 2010    (JP) ................. 2010-269468
Nov. 22, 2011   (JP) ................. 2011-255292

(51) Int. Cl.
B05C 9/10      (2006.01)
B05C 11/00     (2006.01)
(Continued)

(52) U.S. Cl.
CPC ............. G03F 7/0002 (2013.01); B05C 9/12 (2013.01); B05C 11/1021 (2013.01);
(Continued)

(58) Field of Classification Search
None
See application file for complete search history.

(56) References Cited

U.S. PATENT DOCUMENTS

2007/0145639 A1   6/2007  Seki et al.
2007/0246850 A1  10/2007  Schumaker
(Continued)

FOREIGN PATENT DOCUMENTS

JP   2002001195 A   1/2002
JP   2009060084 A   3/2009

OTHER PUBLICATIONS

Office Action issued in Japanese Application No. 2011-255292 mailed Jul. 28, 2015. English translation was provided.
(Continued)

Primary Examiner — Dah-Wei D Yuan
Assistant Examiner — Jethro Pence
(74) Attorney, Agent, or Firm — Rossi, Kimms & McDowell LLP

(57) ABSTRACT

The imprint apparatus of the present invention includes a holding unit configured to hold a mold; a particle inspection unit configured to inspect whether or not particle is present on an imprint area, in which the resin pattern is formed, of the substrate; a dispenser configured to apply an uncured resin to the imprint area; a movable unit configured to move the imprint area with respect to the holding unit; and a controller. The movable unit is capable of moving the imprint area to each of an inspection position by means of the inspection unit, an application position by means of the dispenser, and a contacting position by means of the holding unit. Also, the controller causes the inspection unit to perform inspection of the imprint area in association with the movement of the imprint area by means of the movable unit.

7 Claims, 10 Drawing Sheets

Related U.S. Application Data division of application No. 13/305,990, filed on Nov. 29, 2011, now Pat. No. 8,893,649.

(51) Int. Cl.
    *B29C 59/00*     (2006.01)
    *G03F 7/00*     (2006.01)
    *B05C 9/12*     (2006.01)
    *B05D 3/06*     (2006.01)
    *B05D 3/12*     (2006.01)
    *B05C 11/10*     (2006.01)
    *H01L 21/66*     (2006.01)
    *H01L 21/3105*     (2006.01)

(52) U.S. Cl.
    CPC .............. *B05D 3/067* (2013.01); *B05D 3/12* (2013.01); *H01L 21/3105* (2013.01); *H01L 22/20* (2013.01)

(56) References Cited

U.S. PATENT DOCUMENTS

| | | |
|---|---|---|
| 2008/0254626 A1 | 10/2008 | Kasumi et al. |
| 2009/0108483 A1 | 4/2009 | Suehira et al. |
| 2010/0012838 A1 | 1/2010 | Hatakeyama et al. |
| 2010/0072647 A1 | 3/2010 | Tokue |
| 2010/0096766 A1* | 4/2010 | Wang .................... B29C 33/424 264/40.1 |
| 2011/0042352 A1 | 2/2011 | Okushima et al. |

OTHER PUBLICATIONS

Office Action issued in U.S. Appl. No. 13/305,990 mailed Dec. 27, 2013.

Notice of Allowance issued in U.S. Appl. No. 13/305,990 mailed Aug. 1, 2014.

Office Action issued in U.S. Appl. No. 14/272,782 mailed Oct. 3, 2014.

Office Action issued in U.S. Appl. No. 14/272,782 mailed May 8, 2015.

Office Action issued in U.S. Appl. No. 14/272,782 mailed Oct. 8, 2015.

Office Action issued in U.S. Appl. No. 14/272,782 mailed May 19, 2016.

Notice of Allowance issued in U.S. Appl. No. 14/272,782 mailed Oct. 18, 2016.

* cited by examiner

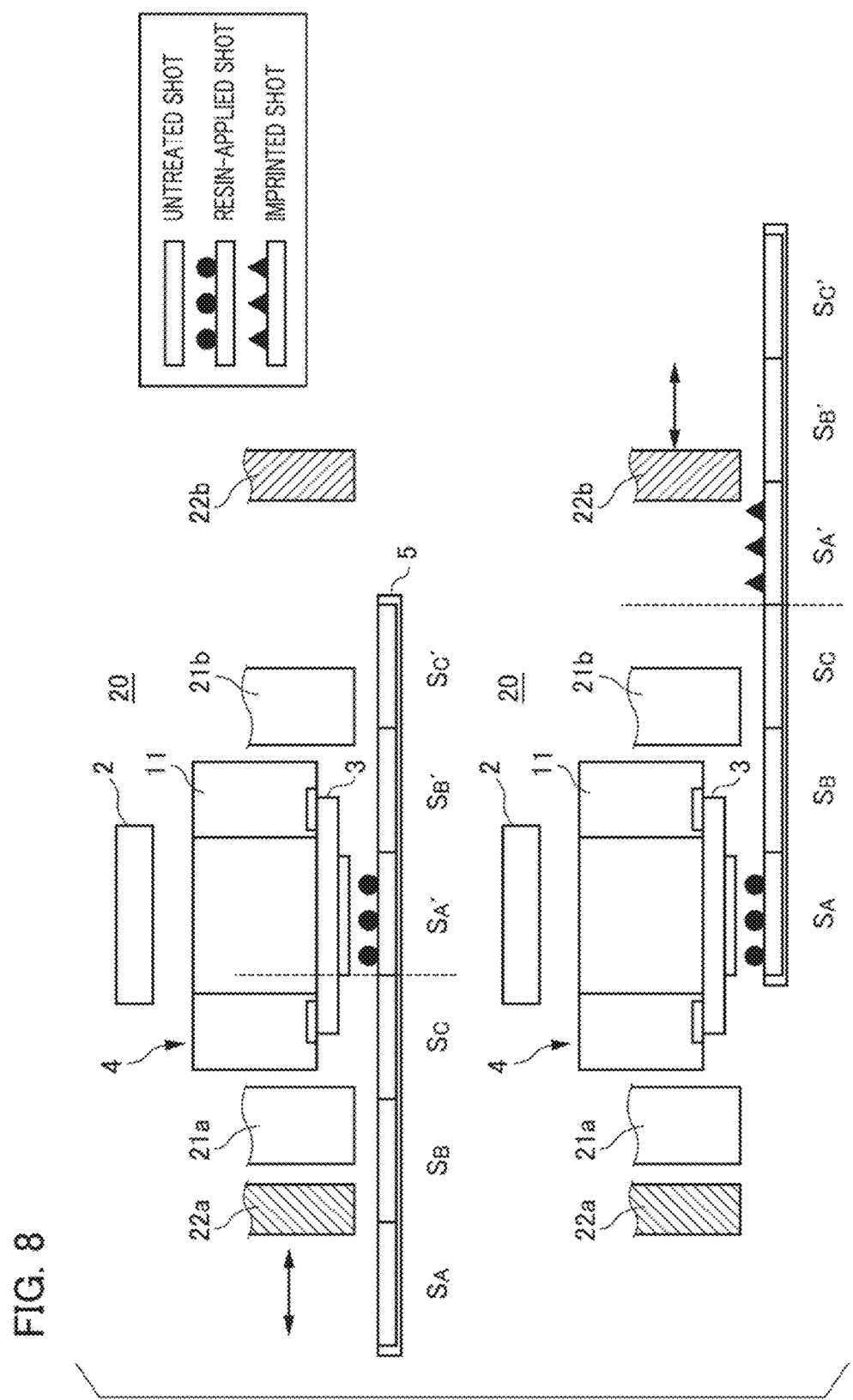

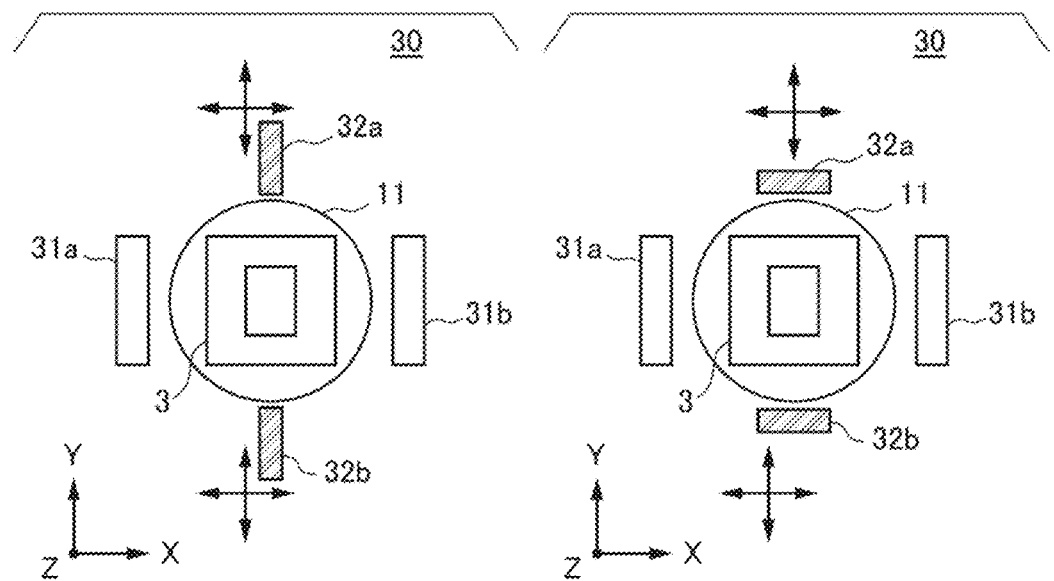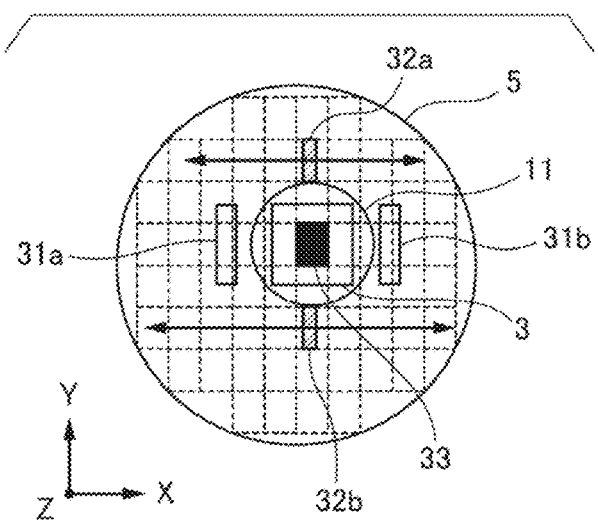

IMPRINT APPARATUS AND ARTICLE MANUFACTURING METHOD

BACKGROUND OF THE INVENTION

Field of the Invention

The present invention relates to an imprint apparatus and an article manufacturing method using the same.

Description of the Related Art

As the demand for microfabrication of semiconductor devices increases, not only a conventional photolithography technology but also a microfabrication technology in which a mold and an uncured resin on a substrate are brought into contact with each other to thereby form a resin pattern, which corresponds to the fine concave and convex pattern formed on the mold, on the substrate are present. This technology is also referred to as an "imprint technology", by which a fine structure with dimensions of a few nanometers can be formed on the substrate. One example of imprint technologies includes a photo-curing method. The photo-curing method first applies an ultraviolet curable resin (imprint resin) to the shot area (imprint area) on the substrate. Next, the resin (uncured resin) and a mold are pressed against each other. After the ultraviolet curable resin is irradiated with ultraviolet light for curing, the cured resin is released from the mold, whereby a resin pattern is formed on the substrate. As a method involving the imprint technology, Japanese Patent Laid-Open No. 2009-60084 discloses an imprint method that removes a resin layer of an overflowed region overflowed from a processed region.

Here, in the conventional imprint method (apparatus) disclosed in Japanese Patent Laid-Open No. 2009-60084, if particle is present on an imprint area, the particle may be entrapped when a mold is pressed against a resin, resulting in a damage of the concave and convex pattern formed on the mold.

SUMMARY OF THE INVENTION

Accordingly, the present invention provides an imprint apparatus that efficiently detects particle present on an imprint area while limiting reductions in productivity.

According to an aspect of the present invention, an imprint apparatus that forms a pattern by bringing an uncured resin applied to a substrate into contact with a pattern surface of a mold is provided that includes a holding unit configured to hold the mold; a particle inspection unit configured to inspect whether or not particle is present on an imprint area, in which the resin pattern is formed, of the substrate; a dispenser configured to apply the uncured resin to the imprint area; a movable unit configured to move the imprint area with respect to the holding unit; and a controller configured to control the operation of the holding unit, the particle inspection unit, the dispenser, and the movable unit, wherein the movable unit is capable of moving the imprint area to each of an inspection position by means of the particle inspection unit, an application position by means of the dispenser, and a contacting position by means of the holding unit, and the controller causes the particle inspection unit to perform inspection of the imprint area in association with the movement of the imprint area by means of the movable unit.

According to the present invention, an imprint apparatus that efficiently detects particle present on an imprint area while limiting a reduction in productivity may be provided.

Further features of the present invention will become apparent from the following description of exemplary embodiments with reference to the attached drawings.

BRIEF DESCRIPTION OF THE DRAWINGS

FIG. 8 is a schematic view illustrating how a resin is applied to each shot according to a fourth embodiment.

FIG. 11A is a plan view illustrating the configuration of an imprint apparatus according to a fifth embodiment when the measurement range of a particle inspection unit is set so as to be extended along the Y-axis direction.

FIG. 11B is a plan view illustrating the configuration of an imprint apparatus according to a fifth embodiment when the measurement range of a particle inspection unit is set so as to be extended along the X-axis direction.

FIG. 11C is a plan view illustrating the movement of a mold holding device and a particle inspection unit when the configuration shown in FIG. 11A is employed.

DESCRIPTION OF THE EMBODIMENTS

First Embodiment

Figure 1:
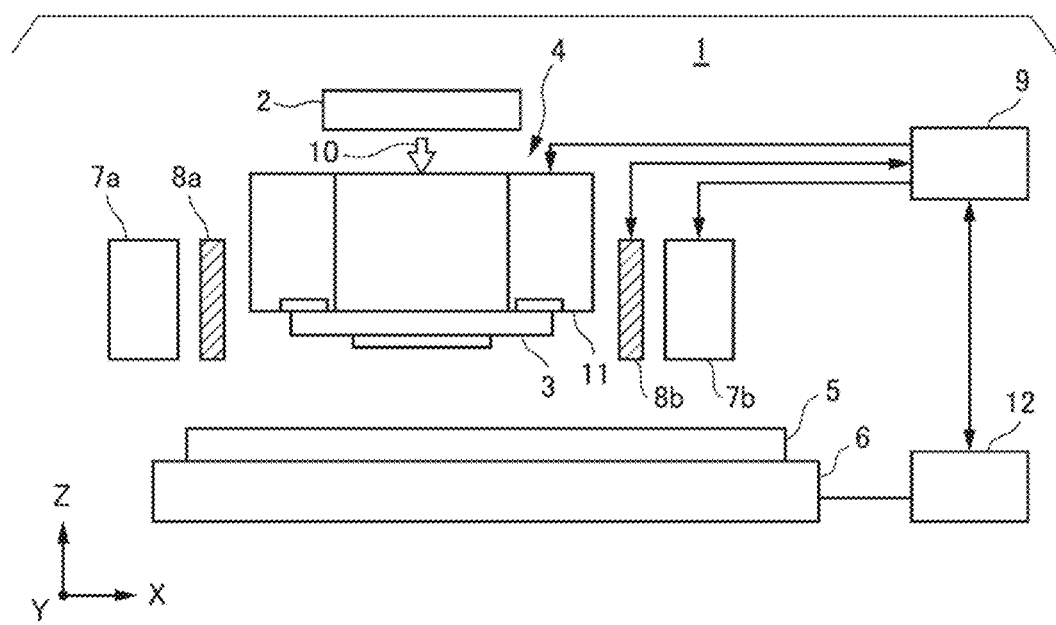
FIG. 1 is a schematic view illustrating the configuration of an imprint apparatus according to a first embodiment of the present invention.

Firstly, a description will be given of the configuration of an imprint apparatus according to a first embodiment of the present invention. FIG. 1 is a schematic view illustrating the configuration of the imprint apparatus of the present embodiment. The imprint apparatus is a processing apparatus that transfers the concave and convex pattern of a mold onto a wafer (a substrate), i.e., a treatment object substrate, which is used in a semiconductor device manufacturing process, and is an apparatus that employs a photo-curing method used in imprint technologies. In the following drawings, a description will be given where the Z axis (vertical direction) is aligned parallel to the irradiation axis of ultraviolet light for a mold, the X axis (horizontal direction) is aligned in the direction in which a wafer stage moves on the basis of a mold holding device to be described below in a plane perpendicular to the Z axis, and the Y axis is aligned in the direction perpendicular to the X axis. Firstly, an imprint apparatus 1 of the present invention includes an illumination unit 2, a mold holding device 4, a wafer stage 6, a dispenser 7, a particle inspection unit 8, and a controller 9.

The illumination unit 2 is a unit configured to irradiate the mold 3 with ultraviolet light during imprint processing. The illumination unit 2 is constituted by a light source (not shown) and a plurality of optical elements that adjust ultraviolet light 10 emitted from the light source to a light suitable for imprinting. The mold 3 is a member in which a predetermined concave and convex pattern (e.g., circuit pattern) is three-dimensionally formed on a side facing a wafer 5. The surface of the concave and convex pattern is processed at high flatness so as to maintain the adhesion between the wafer 5 and the surface. The material of the mold 3 is a material such as quartz or the like through which ultraviolet light can pass.

The mold holding device 4 is a holding unit (contacting unit) configured to hold the mold 3 and press (bring) the pattern surface of the mold 3 against (into contact with) an ultraviolet curable resin applied to the wafer 5. The mold holding device 4 includes a mold base (holding unit) 11 for drawing and holding the mold 3 using suction force or electrostatic force, and a base driving mechanism (not shown) for driving the mold base 11. The base driving mechanism is a driving system that drives the mold base 11 in the Z-axis direction so as to perform a contacting operation. An actuator employed for the driving mechanism is not particularly limited. A linear motor, an air cylinder, and the like may be employed. In the imprint apparatus 1 of the present embodiment, the mold 3 is pressed against an ultraviolet curable resin on the fixed wafer 5. In contrast, an ultraviolet curable resin on the wafer 5 may be pressed against the fixed mold 3. In this case, a wafer stage 6 to be described below is the contacting unit.

The wafer 5 is a treatment object substrate consisting of, for example, a single crystal silicon, and the ultraviolet curable resin (hereinafter referred to simply as "resin"), which serves as a portion to be molded, is applied to the treatment surface. Also, the wafer stage 6 is a substrate holding unit (movable unit) configured to hold (mount) the wafer 5 by vacuum suction and be freely moveable in the XY plane on the mold holding device 4. The wafer stage 6 includes an auxiliary member (chuck) for directly holding the wafer 5, and an actuator for driving an assisting member (all of which are not shown). The wafer stage 6 also includes a mechanism (not shown) that not only performs accurate positioning for overlapping the pattern but also adjusts the attitude of the surface of the wafer 5. The wafer stage 6 is controlled by a positioning unit 12 in conjunction with the driving of the actuator.

The dispenser 7 is a unit configured to apply an ultraviolet curable resin to the wafer 5. In the present embodiment, two dispensers 7 are provided at the positive side and the negative side on the X axis on the basis of the mold holding device 4 in the moving direction of the wafer stage 6. An ultraviolet curable resin is a photocurable resin (imprint resin) having the property of being cured by receiving irradiation of ultraviolet light, and is appropriately selected by the type of semiconductor device to be manufactured. Hereinafter, an ultraviolet curable resin is simply referred to as a "resin" and a resin that is in its uncured state prior to irradiation of ultraviolet light is referred to as an "uncured resin" for simplicity. Here, since a resin is highly volatile and is generally applied for one to several shots (imprint area), the dispenser 7 is provided in proximity to the mold base 11 such that the movement distance of the wafer stage 6 is made as short as much as possible. While the number of the dispensers 7 installed is plural as shown in FIG. 1 in order to improve the productivity of devices, at least one dispenser 7 may be provided as long as the productivity is sufficiently satisfied.

The particle inspection unit 8 is a unit configured to inspect whether or not particle is present (attached) on the wafer 5. The particle inspection unit 8 includes an illumination system that illuminates light towards the shot on the wafer 5, and a detection system that receives scattered light from the shot (none of which are shown). Also, the particle inspection unit 8 is provided at two locations between the mold holding device 4 and the dispensers 7 one each at a positive side and a negative side on the X axis on the basis of the mold holding device 4 in the moving direction of the wafer stage 6. Note that the effect of the particle inspection performed by the particle inspection unit 8 will be described below. The configuration of the particle inspection unit 8 is not limited thereto. For example, an imaging unit that performs particle inspection by photographing a shot using a CCD sensor or the like is also applicable.

The controller 9 is a unit configured to control the operation, adjustment, and the like of the components of the imprint apparatus 1. The controller 9 is constituted by a computer having a storage unit such as a magnetic storage medium or the like, a sequencer, or the like that is connected to the components of the imprint apparatus 1 through a line, and executes control of the components by a program or a sequence. Note that the controller 9 may be integrated with the imprint apparatus 1, or may be installed at a location separate from the location where the imprint apparatus 1 is installed to thereby be controlled remotely.

Figure 2:
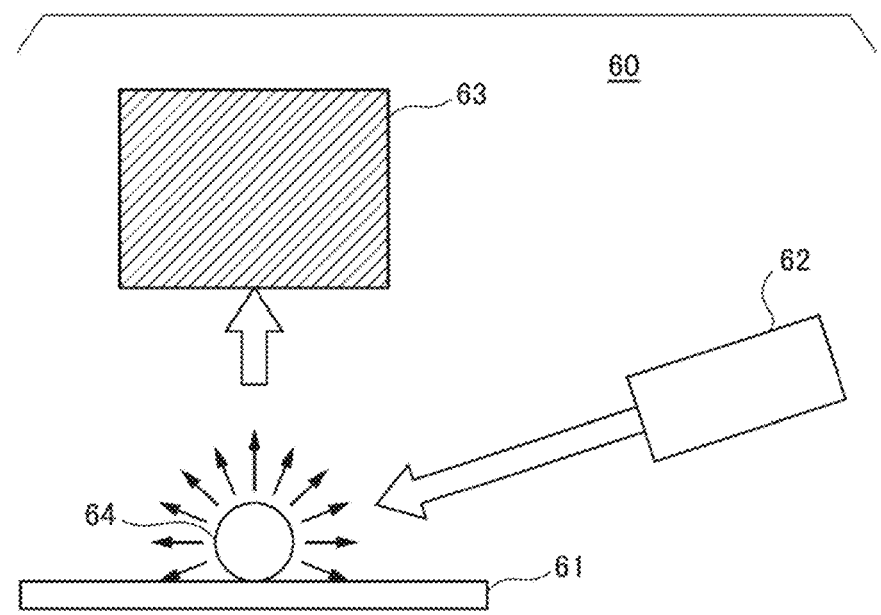
FIG. 2 is a schematic view illustrating a conventional particle inspection unit.

Next, a description will be given of an imprint method including a particle inspection step of detecting particle present on an imprint area on the wafer 5 using the particle inspection unit 8, which is a feature of the present embodiment. FIG. 2 is a schematic view illustrating a conventional particle inspection unit 60. The particle inspection unit 60 includes an illumination system 62 that illuminates light towards the shot on the wafer 61, and a detection system 63 that receives scattered light from the shot. Here, when the illumination system 62 illuminates light and no particle is present on the shot, incident light that is incident to the shot is specularly-reflected on the surface of the wafer 61. Hence, the detection system 63 does not receive reflected light. In contrast, when the particle 64 is present on the shot as shown in FIG. 2, incident light is scattered by the particle 64, and thus, light is reflected at angles other than the specular angle. Thus, the detection system 63 detects the particle 64 by receiving the scattered light. Note that a particle inspection unit may determine the presence/absence of particle using the differences by comparing the images or signals for a plurality of shots. In the imprint apparatus 1 of the present embodiment, the particle inspection unit 8 preferably performs particle inspection for each shot in association with the movement of the wafer stage 6 between a contacting step and an application step. With this arrangement, the inspection time can be reduced compared with the case where particle inspection is performed on the entire surface of the wafer 61 prior to the contacting step of pressing the mold against the resin on the wafer 61. Since the time required between the particle inspection step and the contacting step can also be reduced, the possibility that new particle may become attached to the wafer 61 may be reduced.

Figure 3:
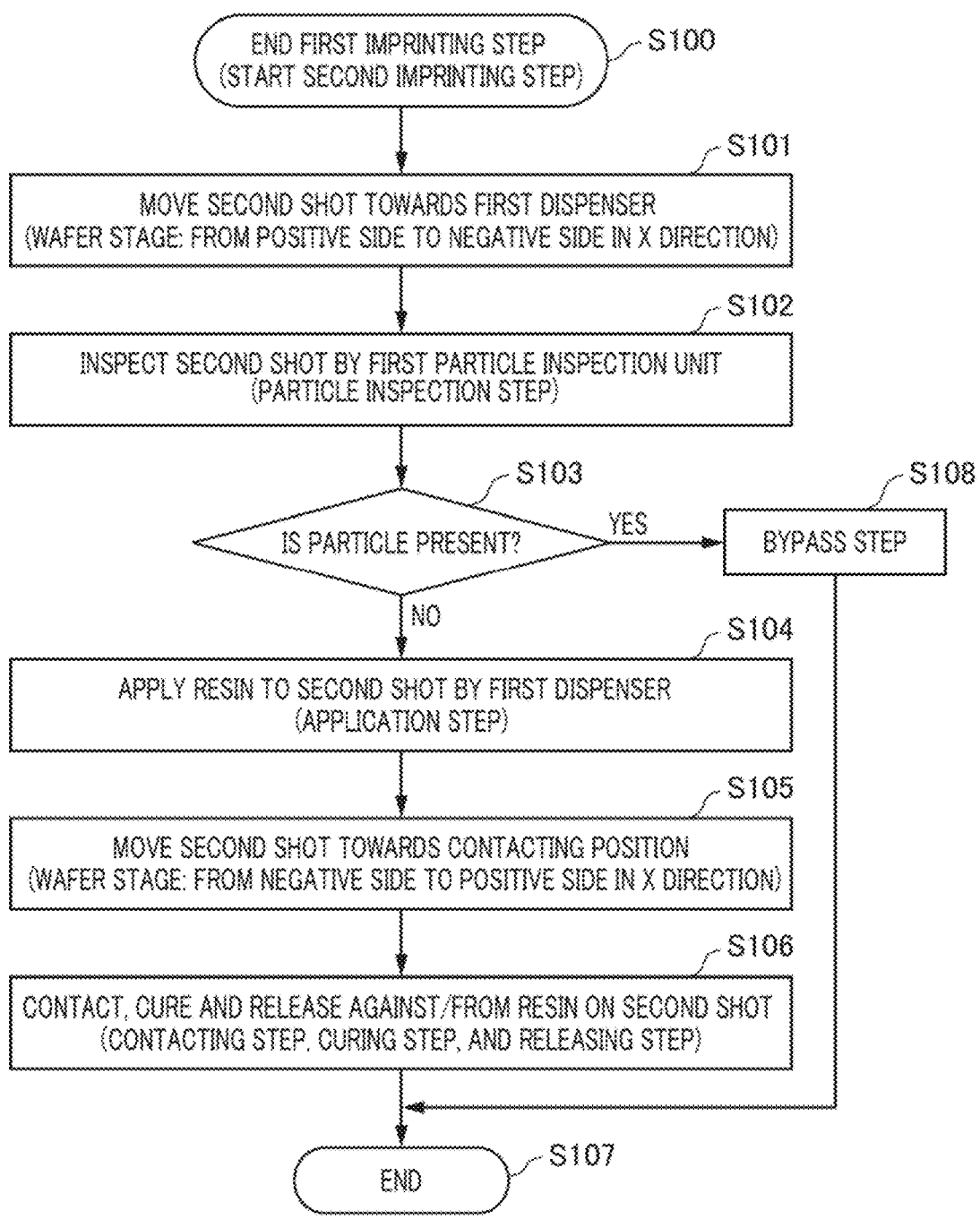
FIG. 3 is a flowchart illustrating an imprinting step according to a first embodiment.
Figure 4A:
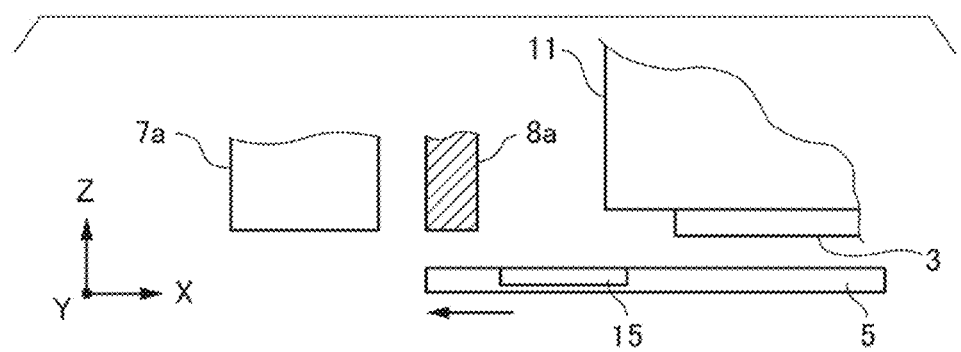
FIG. 4A is a schematic view illustrating the movement of the components in step S101 shown in FIG. 3.
Figure 4B:
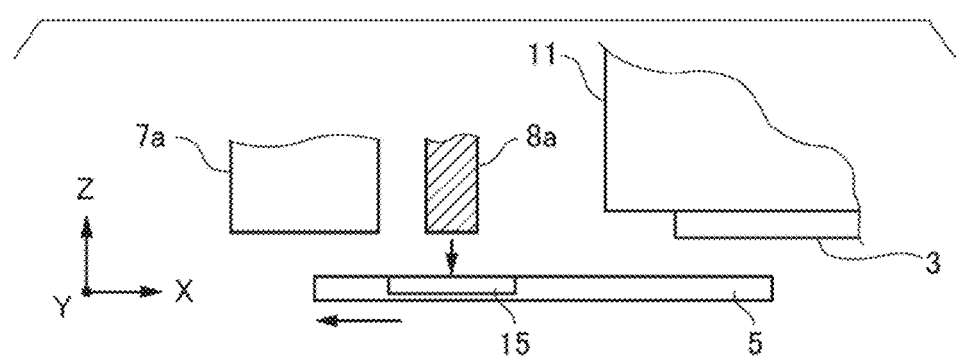
FIG. 4B is a schematic view illustrating the movement of the components in step S102 shown in FIG. 3.
Figure 4C:
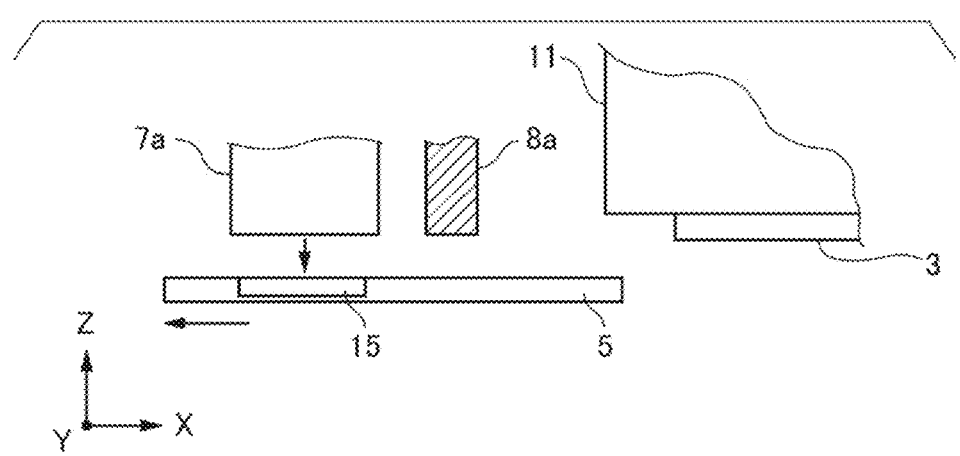
FIG. 4C is a schematic view illustrating the movement of the components in step S104 shown in FIG. 3.

FIG. 3 is a flowchart illustrating the flow of the imprinting step of the present embodiment. Each of FIGS. 4A to 4C is a schematic view illustrating the movement of the components in the imprint apparatus 1 corresponding to each of the steps in the imprinting step shown in FIG. 3. Here, the controller 9 executes a second imprinting step for a next shot (a second shot 15) on the wafer 5 on which a first imprinting step (step S100) for the previous shot (first shot) has been completed. In this case, in order to apply a resin to the second shot 15, the controller 9 firstly drives the wafer stage 6 from the positive side to the negative side in the X-axis direction such that the second shot 15 is positioned at the application position of a first dispenser 7a as shown in FIG. 4A (step S101). At this time, as shown in FIG. 4B, the second shot 15 passes through the inspection position of a first particle inspection unit 8a that is located between the mold 3 and the first dispenser 7a. Thus, the controller 9 causes the first particle inspection unit 8a to perform particle inspection on the surface of the second shot 15 (particle inspection step: step S102). Here, the controller 9 determines whether or not particle is present on the surface of the second shot 15 based on the inspection result obtained by the first particle inspection unit 8a (step S103). When the controller 9 determines in step S103 that no particle is present (No), the controller 9 continues the driving of the wafer stage 6 as it is as shown in FIG. 4C, and causes the second shot 15 to be positioned at the application position of the first dispenser 7a to thereby apply a resin to the second shot 15 (application step: step S104). Next, the controller 9 drives the wafer stage 6 from the negative side to the positive side in the X-axis direction such that the second shot 15 is positioned at the contacting position of the mold 3 (step S105). Then, the controller 9 executes the contacting step for the second shot 15. After the resin is irradiated with ultraviolet light for curing (curing step), the controller 9 executes a releasing step (step S106), and thus, the second imprinting step is ended (step S107).

On the other hand, when the controller 9 determines in step S103 that particle is present on the surface of the second shot 15 (Yes), the controller 9 proceeds to a bypass step of bypassing the normal application and contacting steps (step S108). In the bypass step, for example, the controller 9 ends the second imprinting step without performing the application and contacting steps subject to the second shot 15. With this arrangement, the imprint operation can be avoided while particle is present on the surface of the wafer 5, which prevents the concave and convex pattern formed on the mold 3 from being broken.

In the bypass step in step S108, the controller 9 may execute only the application step for the second shot 15. In other words, in consideration of post-steps such as an etching step or the like included in the manufacturing process of a semiconductor device, the difference between the structure of the second shot 15 and that of another shot subjected to the imprinting step normally occurs when the imprinting step is not subject only to the second shot 15 on which particle is present. Thus, in the bypass step, the controller 9 may decrease the difference by executing only the application step of applying a resin to one surface of the second shot 15. Furthermore, in the bypass step, the controller 9 may stop all of the post-imprinting steps. In this case, the controller 9 temporarily stops all of the imprinting steps, and specifies the cause of the attachment of particle to remove the cause, whereby the controller 9 can newly perform the imprinting step.

The imprint apparatus 1 of the present embodiment sequentially performs the imprinting step shown in FIG. 3 to a plurality of shots alternately using a pair of the first dispenser 7a and the first particle inspection unit 8a, and the other pair of a second dispenser 7b and a second particle inspection unit 8b opposing thereto. In other words, in the second imprinting step for the second shot 15, the wafer stage 6 is moved from the negative side to the positive side in the X-axis direction when the process transfers to the contacting step in step S106. Thus, when the imprinting step is performed on the next third shot (not shown), the controller 9 moves the wafer stage 6 as it is from the negative side to the positive side in the X-axis direction, and executes a third imprinting step using the second dispenser 7b and the second particle inspection unit 8b. With this arrangement, the imprint apparatus 1 performs the imprinting step individually for a plurality of shots in parallel with the moving direction of the wafer stage 6, resulting in no reduction in productivity.

As described above, according to the imprint apparatus 1 of the present embodiment, particle present on an imprint area may be efficiently detected while limiting a reduction in productivity.

Second Embodiment

Figure 5:
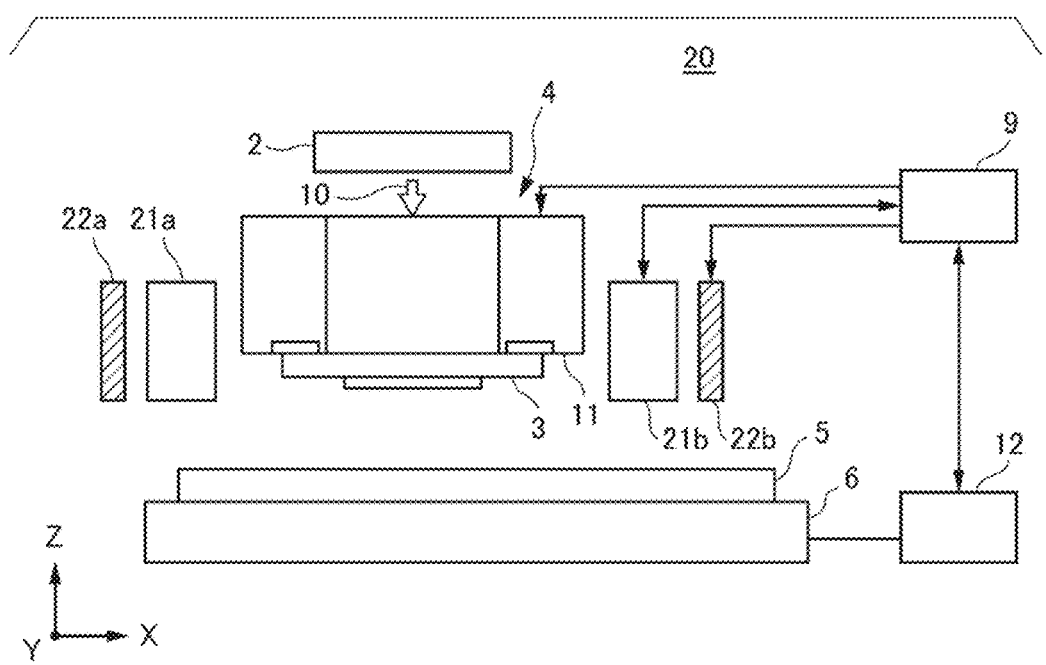
FIG. 5 is a schematic view illustrating the configuration of an imprint apparatus according to a second embodiment.

Next, a description will be given of an imprint apparatus according to a second embodiment of the present invention. FIG. 5 is a schematic view illustrating the configuration of an imprint apparatus 20 of the present embodiment. In FIG. 5, the same elements as those in the imprint apparatus 1 shown in FIG. 1 are designated by the same reference numerals and explanation thereof will be omitted. While, in the first embodiment, the particle inspection unit 8 and the dispenser 7 are sequentially arranged from the mold holding device 4, a feature of the imprint apparatus 20 lies in the fact that a dispenser 21 and a particle inspection unit 22 are sequentially arranged from the mold holding device 4.

Figure 6:
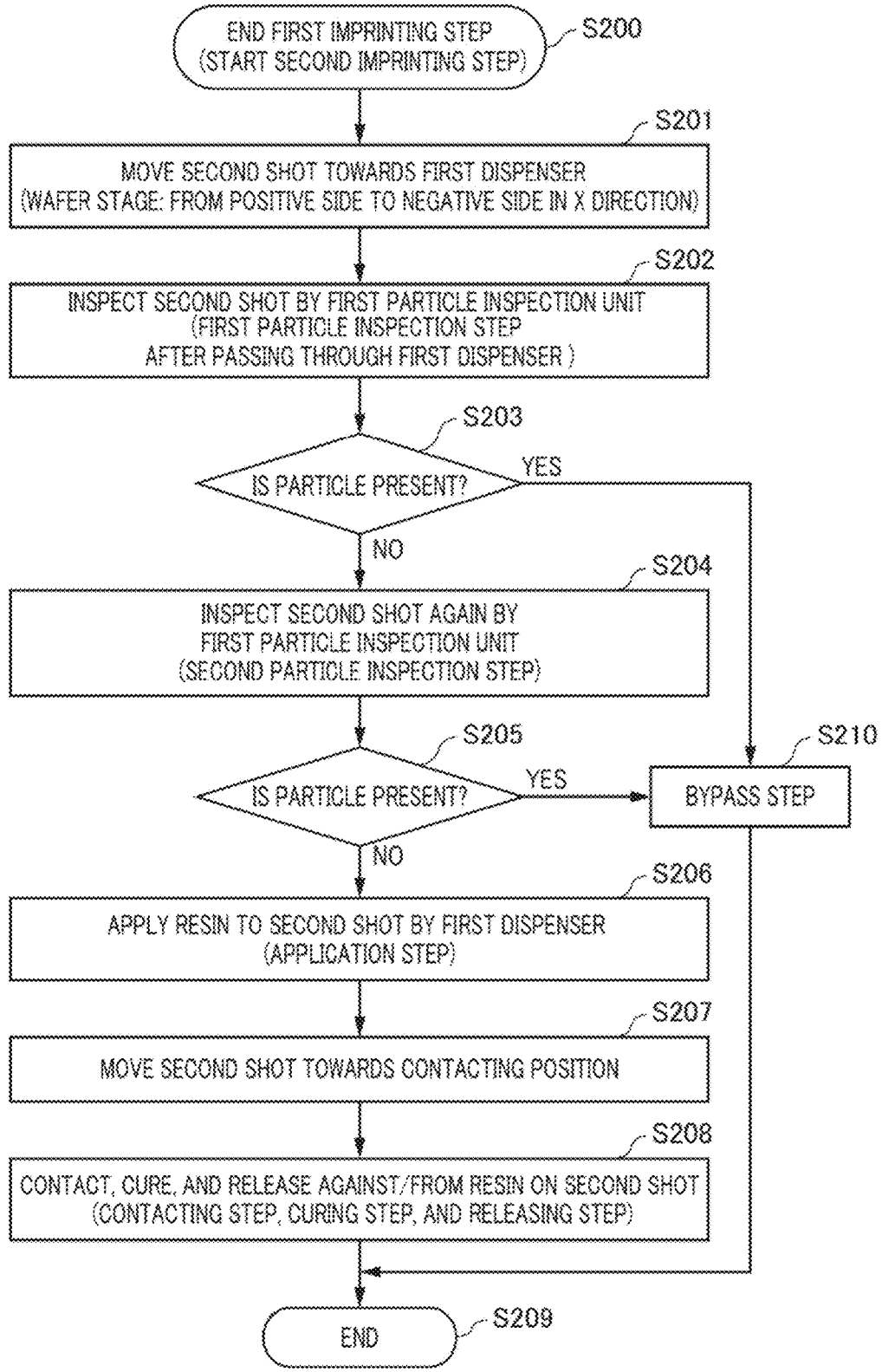
FIG. 6 is a flowchart illustrating an imprinting step according to a second embodiment.
Figure 7A:
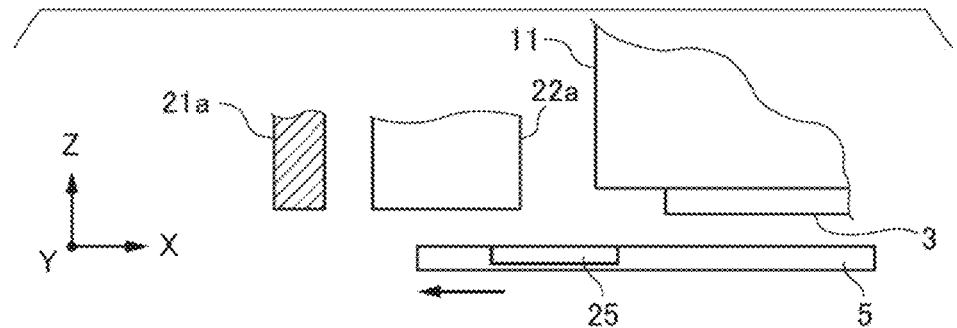
FIG. 7A is a schematic view illustrating the movement of the components in step S201 shown in FIG. 6.
Figure 7B:
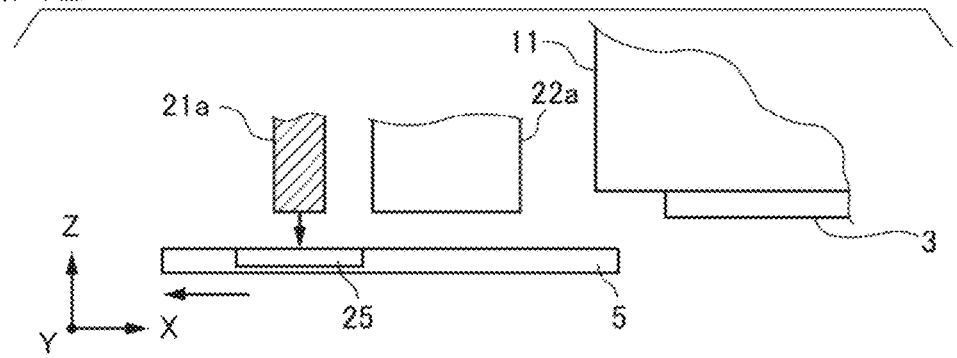
FIG. 7B is a schematic view illustrating the movement of the components in step S202 shown in FIG. 6.
Figure 7C:
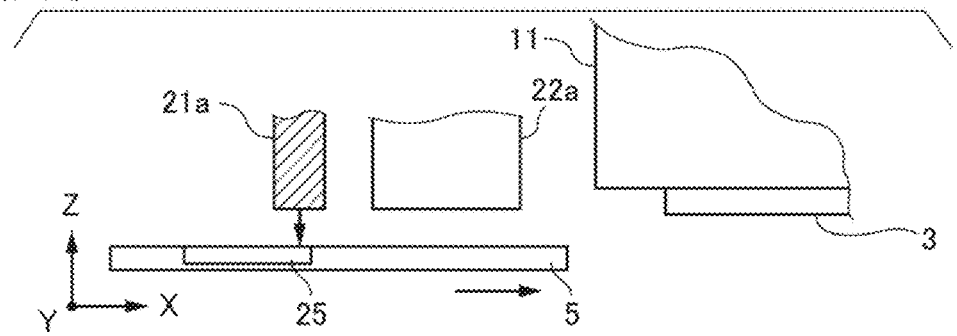
FIG. 7C is a schematic view illustrating the movement of the components in step S204 shown in FIG. 6.
Figure 7D:
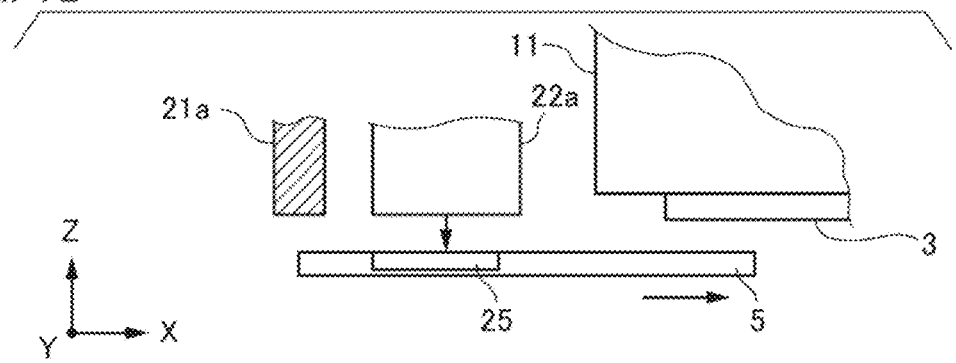
FIG. 7D is a schematic view illustrating the movement of the components in step S206 shown in FIG. 6.

FIG. 6 is a flowchart illustrating the flow of the imprinting step of the present embodiment. Each of FIGS. 7A to 7D is a schematic view illustrating the movement of the components in the imprint apparatus 20 corresponding to the steps in the imprinting step shown in FIG. 6. Also, in this case, the controller 9 executes the second imprinting step for a next shot (a second shot 25) on the wafer 5 on which the first imprinting step (step S200) for the previous shot (first shot) has been completed. In order to apply a resin to the second shot 25, the controller 9 first drives the wafer stage 6 from the positive side to the negative side in the X-axis direction towards the application position of a first dispenser 21a as shown in FIG. 7A (step S201). Here, the controller 9 moves the wafer stage 6 as it is even when the second shot 25 is positioned at the application position of the first dispenser 21a as shown in FIG. 7B. Then, the controller 9 causes the second shot 25 to pass through the inspection position of a first particle inspection unit 22a that is arranged ahead of the first dispenser 21a, and causes the first particle inspection unit 22a to perform first particle inspection on the surface of the second shot 25 (first particle inspection step: step S202). Here, the controller 9 determines whether or not particle is present on the surface of the second shot 25 based on the first inspection result obtained by the first particle inspection unit 22a (step S203). When the controller 9 determines in step S203 that no particle is present (No), the controller 9 drives the wafer stage 6 from the negative side to the positive side in the X-axis direction as shown in FIG. 7C as opposed to the earlier moving direction. Then, the controller 9 causes the second shot 25 to pass through the inspection position of the first particle inspection unit 22a that is arranged ahead of the first dispenser 21a, and causes the first particle inspection unit 22a to perform second particle inspection on the surface of the second shot 25 (second particle inspection step: step S204). Here, the controller 9 determines whether or not particle is present on the surface of the second shot 25 based on the second inspection result obtained by the first particle inspection unit 22a (step S205). When the controller 9 determines in step S205 that no particle is present (No), the controller 9 continues the driving of the wafer stage 6 as it is as shown in FIG. 7D, and causes the second shot 25 to be positioned at the application position of the first dispenser 21a to thereby apply a resin on the second shot 25 (application step: step S206). Next, the controller 9 drives the wafer stage 6 as it is such that the second shot 25 is positioned at the contacting position of the mold 3 (step S207). Then, the controller 9 executes the contacting step for the second shot 25. After the resin is irradiated with ultraviolet light for curing, the controller 9 executes the releasing step (step S208), and thus, the second imprinting step is ended (step S209).

On the other hand, when the controller 9 determines in any one of steps S203 and S205 that particle is present on the surface of the second shot 25 (Yes), the controller 9 proceeds to a bypass step of bypassing the normal application and contacting step (step S210). The bypass step is the same as that in step S108 according to the first embodiment. The imprint apparatus 20 of the present embodiment also sequentially performs the imprinting step shown in FIGS. 6 and 7A to 7D to a plurality of shots alternately using the dispensers 21 and the particle inspection units 22 as in the first embodiment.

As described above, since the imprint apparatus 20 of the present embodiment provides the same effect as that in the first embodiment and the particle inspection unit 22 performs particle inspection two times for the same shot during one imprinting step, the accuracy of particle inspection performed by the particle inspection unit 22 can be improved.

In the present embodiment, particle inspection is performed two times by the particle inspection unit 22 during acceleration/deceleration of the wafer stage 6, and thus, the inspection result requires careful evaluation. In other words, assuming that the particle inspection unit 22 measures particle having the same particle diameter for the same period of time, the amount of scattered light received by the particle inspection unit 22 is small when the traveling speed of the wafer stage 6 is fast, whereas the amount of scattered light received thereby is large when the traveling speed thereof is slow. Thus, the controller 9 outputs the determination result relating to the presence/absence of particle taking into account the correction value corresponding to the traveling speed of the wafer stage 6. It should be noted that the installation position of the particle inspection unit 22 according to the present embodiment is located at the return point of transfer of the wafer stage 6. With this arrangement, the traveling speed of the wafer stage 6 is temporarily reduced, which is advantageous for performing particle inspection with high accuracy.

Third Embodiment

Next, a description will be given of an imprint apparatus according to a third embodiment of the present invention. A feature of the imprint apparatus of the present embodiment lies in the fact that the particle inspection unit 8 (22) shown in the embodiment is movable in parallel to the moving direction of the wafer stage 6 in accordance with the moving direction. In recent years, the traveling speed of the wafer stage 6 has been improved to achieve further improvement in productivity. Thus, since the traveling speed of the wafer 5 upon passing through its detection position is too fast, particle may be undetectable or the detection accuracy may be degraded if the particle inspection unit 8 remains fixed. Accordingly, in the present embodiment, the particle inspection unit 8 is synchronized with the movement of the wafer stage 6, and is moved in parallel at the same timing as the movement of the wafer stage 6 at a velocity different from that of the wafer stage 6 so that the relative speed between the two is reduced. With this arrangement, the accuracy of particle inspection performed by the particle inspection unit 8 can be improved.

Fourth Embodiment

Figure 9:
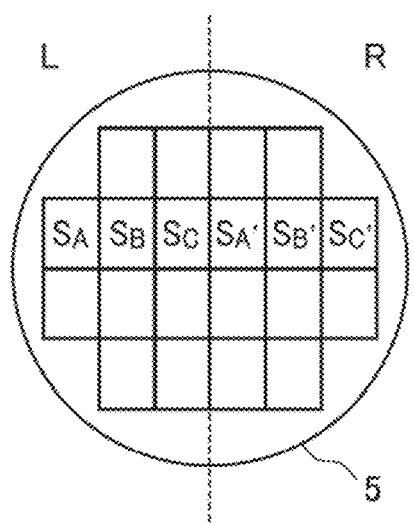
FIG. 9 is a schematic view illustrating the layout of shots on a wafer according to the fourth embodiment.

Next, a description will be given of an imprint apparatus according to a fourth embodiment of the present invention. FIG. 8 is a schematic view illustrating how a resin is applied to each shot using the imprint apparatus of the present embodiment. In FIG. 8, the reference symbols assigned to the shots on the wafer 5 correspond to the shots shown in FIG. 9 to be described below, respectively. On the surface of each shot, a shot with no description is indicative of an "untreated shot", a shot with black circles is indicative of a "resin-applied shot", and a shot with black triangles is indicative of an "imprinted shot". For the purpose of illustration, the configuration of the imprint apparatus shown in FIG. 8 is the same as that of the imprint apparatus 20 according to the second embodiment, but may also be the same as that of the imprint apparatus 1 of the first embodiment. FIG. 9 is a schematic view illustrating the layout of shots on the wafer 5. In the present embodiment, as shown in FIG. 9, it is assumed that the wafer 5 is divided into left and right areas that are aligned with the movement direction of the wafer stage 6 starting from the shot that is positioned at the substantial center of the wafer 5. Then, a row of a plurality of shots arranged in a first region L on the left side are set to $S_A$, $S_B$, and $S_C$ in the order from the outer periphery of the wafer 5, whereas the same row of a plurality of shots arranged in a second region R on the right side are set to $S_A'$, $S_B'$, and $S_C'$ in the order from the inner periphery of the wafer 5. In consideration of this, a feature of the imprint apparatus of the present embodiment lies in the fact that another shot is subject to a particle inspection step while one shot is subject to an imprinting step (contacting step, curing step, and releasing step).

Figure 10:
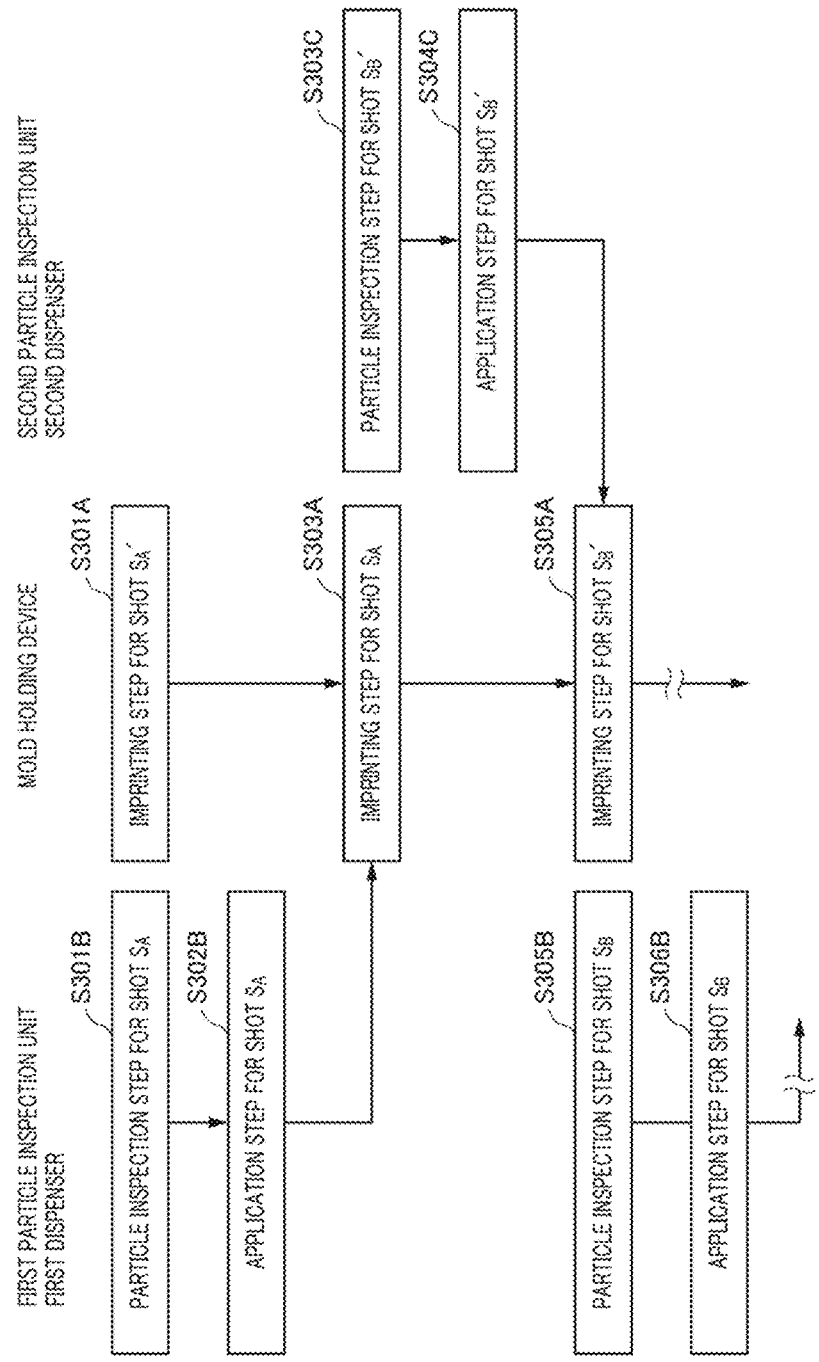
FIG. 10 is a flowchart illustrating an imprinting step according to a fourth embodiment.

FIG. 10 is a flowchart illustrating the flow of the imprinting step of the present embodiment. Firstly, the controller 9 executes a contacting step for a shot (first imprint area) $S_A'$ on which a resin has already been applied (step S301A). At this time, the controller 9 executes a particle inspection on the surface of the shot $S_A$ using the first particle inspection unit 22a in parallel with the contacting step for the shot $S_A'$ as shown in the top view in FIG. 8 (step S301B). Next, the controller 9 drives the wafer stage 6 from the negative side to the positive side in the X-axis direction, and causes the first dispenser 21a to apply a resin to the shot $S_A$ for which a particle inspection has been completed (step S302B). Next, the controller 9 drives the wafer stage 6 again from the negative side to the positive side in the X-axis direction so as to align the shot $S_A$ with the contacting position, and executes a contacting step for the shot $S_A$ (step S303A). At this time, as shown in the bottom view shown in FIG. 8, the controller 9 executes a particle inspection on the surface of the shot $S_B'$ using a second particle inspection unit 22b parallel to the contacting step for the shot $S_A$ (step S303C). Next, the controller 9 drives the wafer stage 6 from the positive side to the negative side in the X-axis direction, and causes a second dispenser 21b to apply a resin to the shot $S_B'$ for which a particle inspection has been completed (step S304C). Next, the controller 9 drives the wafer stage 6 again from the positive side to the negative side in the X-axis direction so as to align the shot $S_B'$ with the contacting position, and executes a contacting step for the shot $S_B'$ (step S305A). Hereinafter, the controller 9 repeats step S305B, step S306B, and the aforementioned imprinting step in accordance with the desired number of shots. In the present embodiment, it is desirable that the particle inspection units 22a and 22b perform particle inspection while moving in parallel in synchronization with the movement of the wafer stage 6 as in the third embodiment. For example, some shots may not be subject to a particle inspection in the imprinting step due to the size of the mold holding device 4 (the mold base 11) and the relative positions between the mold 3 and the dispenser 21 and the particle inspection unit 22. However, since the number of such shots is sufficiently smaller than the number of all shots, such shots may be inspected by performing a particle inspection in advance separately from the imprinting step.

As described above, since the imprint apparatus of the present embodiment performs a particle inspection step for another untreated shot while performing an imprinting step for one shot. In the imprinting step in this case, that is, in the step in which the pattern surface of the mold 3 is in contact with a resin, the wafer stage 6 is stopped. However, when repeating the imprinting step for a plurality of shots as a series of operations, the particle inspection step of the present embodiment is also performed in association with the movement of the wafer stage 6. Thus, the effect of the embodiment is advantageous for further improvement in productivity.

Fifth Embodiment

Next, a description will be given of an imprint apparatus according to a fifth embodiment of the present invention. Each of FIGS. 11A to 11C is a schematic view illustrating the configuration of an imprint apparatus 30 of the present embodiment. In particular, FIG. 11A and FIG. 11B are plan views illustrating the imprint apparatus 30 viewed from the top along the Z-axis direction. In the aforementioned embodiments, a dispenser and a particle inspection unit are disposed coaxially with the moving direction of the wafer stage 6 on the basis of the mold holding device 4. In contrast, a feature of the imprint apparatus 30 of the present embodiment lies in the fact that a dispenser 31 is disposed on the X axis coaxially with the moving direction of the wafer stage 6, whereas a particle inspection unit 32 is disposed on the Y axis perpendicular to the moving direction of the wafer stage 6 on the basis of the mold holding device 4. The other aspects of the configuration of the imprint apparatus 30 are the same as those of the imprint apparatus 1 in the first embodiment and are designated by the same reference numerals and explanation thereof will be omitted.

Here, while the particle inspection unit 32a and 32b, which are disposed at two locations, generally move as a unitary block (synchronously) with the mold holding device 4, the particle inspection unit 32a and 32b may also be movable as a single unit in the moving direction (the X-axis direction) and in the direction (the Y-axis direction) perpendicular to the moving direction separately from the synchronous movement. As shown in FIG. 11A and FIG. 11B, the measurement range (measurement length) of the particle inspection unit 32 may be changed as appropriate. In other words, if the measurement range of the particle inspection unit 32 is set to be elongated along the Y-axis direction as shown in FIG. 11A, such configuration is efficient for performing a scan-measurement in the X-axis direction. In this case, the movement of the particle inspection unit 32 in the Y-axis direction as appropriate allows the rows of a shot to be inspected to be changed so as to optimize the inspection rows in association with the layout of the shot. On the other hand, if the measurement range of the particle inspection unit 32 is set so as to be elongated along the X-axis direction as shown in FIG. 11B, such configuration is efficient for performing a scan-measurement in the Y-axis direction. Also, in this case, in the reverse to the description of FIG. 11A, the movement of the particle inspection unit 32 in the X-axis direction as appropriate allows the inspection rows in association with the layout of the shot to be optimized.

Next, a detailed description will be given of the movement of the mold holding device 4 and the particle inspection unit 32 with respect to the wafer 5 during a particle inspection. FIG. 11C is a plan view illustrating the movement of the mold holding device 4 and the particle inspection unit 32. The configuration shown in FIG. 11A is employed for the imprint apparatus 30. Here, it is assumed that the imprint apparatus 30 is carrying out an imprinting step for a black-solid shot 33. At this time, a relatively long period time is required for filling a resin into the concave and convex pattern of the mold 3. Thus, two particle inspection units 32a and 32b perform a scan-measurement in the X-axis direction for the time period so as to inspect whether or not particle is present on each inspection row of the shot. When the imprinting step has been completed for one row of the shot 33, the imprint apparatus 30 performs an imprinting step on another inspection row for which a particle inspection has already been completed. For example, if the measurement range of the particle inspection unit 32 is wide enough to catch a plurality of rows, the particle inspection unit 32 may inspect a plurality of rows in a simultaneous manner. Also, if there is sufficient allowance of a resin filling time, the particle inspection unit 32 moves in the Y-axis direction, and changes the inspection row by itself so as to continue the particle inspection. As described above, since the imprint apparatus 30 of the present embodiment performs an imprinting step and a particle inspection step in a parallel manner for a plurality of rows on a shot, the effect of the embodiment is advantageous for further improvement in productivity.

(Article Manufacturing Method)

A method of manufacturing devices (a semiconductor integrated circuit element, liquid crystal display element, and the like) as an article includes a process for transferring (forming) a pattern on a substrate (a wafer, glass plate, or film-like substrate) using the aforementioned imprint apparatus. Furthermore, the manufacturing method can include a process for etching the substrate on which the pattern is transferred. Note that upon manufacturing other articles such as patterned media (recording media) or optical elements, the manufacturing method can include other process for processing the substrate on which the pattern is transferred in place of etching. The article manufacturing method of this embodiment has an advantage, as compared with a conventional article manufacturing method, in at least one of performance, quality, productivity and production cost of an article.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2010-269468 filed Dec. 2, 2010 and No. 2011-255292 filed Nov. 22, 2011 which are hereby incorporated by reference herein in its entirety.

What is claimed is:

1. An imprint apparatus that forms a pattern of an imprint material on a substrate by using a mold, the imprint apparatus comprising:
    a holding unit configured to hold the substrate on which a first area and a second area different from the first area are provided;
    a dispenser configured to apply the imprint material to the substrate; and
    a particle inspection unit configured to inspect whether or not a particle is present on the second area where the imprint material is not applied while an imprinting step for the first area is performed.

2. The imprint apparatus according to claim 1, wherein the particle inspection unit determines there is the particle present on the second area, in a case where the particle inspection unit detects scattered light of light illuminated to the second area, the scattered light being scattered by the particle on the second area.

3. The imprint apparatus according to claim 1, wherein the particle inspection unit includes a CCD sensor and determines whether or not the particle is present on the second area based on the result of photographing.

4. The imprint apparatus according to claim 1, wherein the second area is an area on which the pattern of the imprint material is to be formed after forming the pattern of the imprint material on the first area.

5. The imprint apparatus according to claim 1, wherein the imprint apparatus is configured to avoid forming the pattern of the imprint material on the second area, in the case where the particle inspection unit determines there is the particle on the second area.

6. The imprint apparatus according to claim 1, wherein the imprint step includes:
    contacting the mold and the imprint material applied to the first area;
    curing the imprint material; and
    releasing the mold from the cured imprint material.

7. The imprint apparatus according to claim 1, wherein the pattern of the imprint material is a pattern of a resin and the dispenser applies an uncured resin as the imprint material onto the substrate.

* * * * *